United States Patent
Tsuchiya et al.

(10) Patent No.: US 8,853,728 B2
(45) Date of Patent: Oct. 7, 2014

(54) LED MOUNTING SUBSTRATE AND METHOD OF MANUFACTURING THE SAME

(71) Applicant: Toyoda Gosei Co., Ltd., Kiyosu (JP)

(72) Inventors: Yosuke Tsuchiya, Kiyosu (JP); Shota Shimonishi, Kiyosu (JP); Hiroyuki Tajima, Kiyosu (JP); Akira Sengoku, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/919,874

(22) Filed: Jun. 17, 2013

(65) Prior Publication Data

US 2014/0014992 A1    Jan. 16, 2014

(30) Foreign Application Priority Data

Jul. 10, 2012 (JP) ................ 2012-154827

(51) Int. Cl.
*H01L 33/00* (2010.01)
*H01L 33/60* (2010.01)
*H05K 1/02* (2006.01)

(52) U.S. Cl.
CPC ........ *H01L 33/60* (2013.01); *H05K 2201/2054* (2013.01); *H05K 2201/09745* (2013.01); *H05K 1/0274* (2013.01)
USPC .............. 257/98; 257/94; 257/96; 257/99; 257/100; 257/103

(58) Field of Classification Search
None
See application file for complete search history.

(56) References Cited

U.S. PATENT DOCUMENTS

2006/0268567 A1 * 11/2006 Jang et al. ............... 362/555
2007/0200128 A1    8/2007 Yano

FOREIGN PATENT DOCUMENTS

JP    2008/258296 A    10/2008
WO  WO 2005/031882 A1    4/2005

* cited by examiner

*Primary Examiner* — Kyoung Lee
(74) *Attorney, Agent, or Firm* — McGinn IP Law Group, PLLC

(57) ABSTRACT

An LED mounting substrate includes a base substrate, a conductive pattern formed on the base substrate and including a recessed portion on an upper surface thereof, and a light reflecting film formed in an inter-pattern gap of the conductive pattern on the base substrate and in the recessed portion of the conductive pattern.

9 Claims, 4 Drawing Sheets

LED MOUNTING SUBSTRATE AND METHOD OF MANUFACTURING THE SAME

The present application is based on Japanese patent application No.2012-154827 filed on Jul. 10, 2012, the entire contents of which are incorporated herein by reference.

BACKGROUND OF THE INVENTION

1. Field of the Invention

The invention relates to an LED mounting substrate and a method of manufacturing the LED mounting substrate.

2. Related Art

A light-emitting device is known that a white resist film is provided in a gap (inter-pattern gap) formed on a substrate between evaporated metal films to be conductive layers (see, e.g., WO 2005/031882).

In the light-emitting device disclosed in WO 2005/031882, the white resist film reflects/blocks light emitted from an LED chip, thereby improving emission intensity.

SUMMARY OF THE INVENTION

It is an object of the invention to provide an LED mounting substrate that allows the formation of a light-emitting device excellent in light extraction efficiency, as well as a method of manufacturing the LED mounting substrate.

(1) According to one embodiment of the invention, an LED mounting substrate comprises:
  a base substrate;
  a conductive pattern formed on the base substrate and comprising a recessed portion on an upper surface thereof; and
  a light reflecting film formed in an inter-pattern gap of the conductive pattern on the base substrate and in the recessed portion of the conductive pattern.

In the above embodiment (1) of the invention, the following modifications and changes can be made.

(i) An upper surface level of the conductive pattern in a region without the recessed portion is equal to an upper surface level of the light reflecting film.

(ii) The light reflecting film comprises a resin material containing a white filler.

(iii) The light reflecting film comprises an insulating film.

(iv) The light reflecting film has a reflectivity higher than the base substrate and the conductive pattern.

(v) The base substrate comprises a ceramic substrate.

(2) According to another embodiment of the invention, a method of manufacturing an LED mounting substrate comprises:
  forming a conductive pattern on the base substrate, the conductive pattern comprising a recessed portion on an upper surface thereof;
  filling a light-reflecting resin in an inter-pattern gap of the conductive pattern and also in the recessed portion of the conductive pattern; and
  forming a light reflecting film by flattening the light-reflecting resin so that the light reflecting film has an upper surface level equal to that of the conductive pattern in a region with no recessed portion.

In the above embodiment (2) of the invention, the following modifications and changes can be made.

(vi) The filling of the light-reflecting resin is performed by screen printing.

(vii) The light-reflecting resin is applied onto an entire surface of the base substrate and the conductive pattern so as to fill the light-reflecting resin in the inter-pattern gap of the conductive pattern and in the recessed portion of the conductive pattern.

Points of the Invention

According to one embodiment of the invention, an LED mounting substrate is constructed such that a light reflecting film is formed in an inter-pattern gap and a recessed portion of a conductive pattern on a base substrate so as to efficiently reflect light emitted from an LED chip and to suppress the light absorption by the base substrate and the conductive pattern. Thus, it is possible to manufacture a light-emitting device excellent in light extraction efficiency by using the LED mounting substrate.

BRIEF DESCRIPTION OF THE DRAWINGS

Next, the present invention will be explained in more detail in conjunction with appended drawings, wherein.

DESCRIPTION OF THE PREFERRED EMBODIMENTS

First Embodiment

Figure 1:
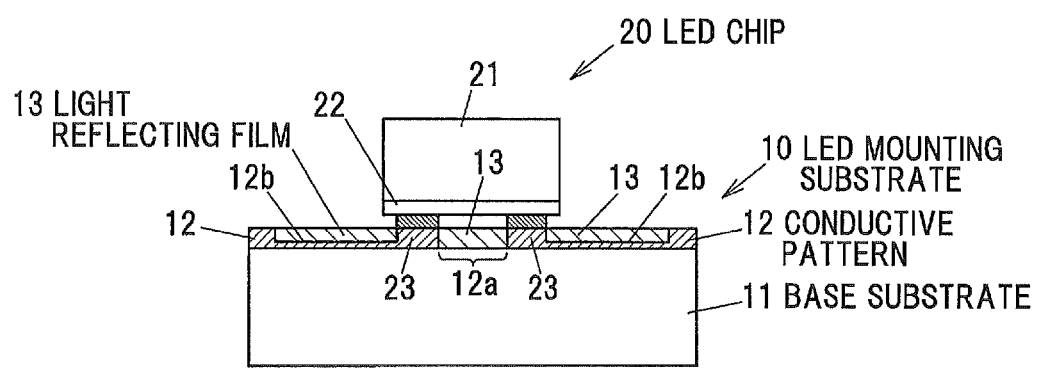
FIG. 1 is a vertical cross-sectional view showing an LED mounting substrate and an LED chip in a first embodiment.

FIG. 1 is a vertical cross-sectional view showing an LED mounting substrate and an LED chip in the first embodiment.

An LED mounting substrate 10 has a base substrate 11, a conductive pattern 12 located on the base substrate 11 and having a recessed portion 12b on an upper surface thereof, and a light reflecting film 13 formed in an inter-pattern gap 12a of the conductive pattern 12 (a gap formed between conductive films constituting the conductive pattern 12) so as to be located on the base substrate 11 and also in the recessed portion 12b of the conductive pattern 12.

An LED chip 20 is a flip-chip type LED chip and has a chip substrate 21 and a crystal layer 22. The chip substrate 21 is, e.g., a sapphire substrate. The crystal layer 22 is a layer formed on the chip substrate 21 by epitaxial crystal growth and has a light-emitting layer sandwiched between an n-type semiconductor layer and a p-type semiconductor layer.

The n-type and p-type semiconductor layers of the crystal layer 22 are respectively connected to the conductive pattern 12 of the LED mounting substrate 10 via connecting portions 23 such as conductive bumps or conductive paste. The LED chip 20 is not limited to a flip-chip type and may be, e.g., a face-up type. Alternatively, the LED chip 20 may be connected to the conductive pattern 12 by wires instead of using the connecting portions 23.

The base substrate 11 is, e.g., a ceramic substrate formed of ceramic such as aluminum oxide (alumina) or aluminum nitride.

The conductive pattern 12 is composed of conductive films having a structure in which, e.g., an Ni film and an Au film are stacked on a Cu film. The conductive pattern 12 has the recessed portion 12b on the upper surface thereof. The recessed portion 12b is formed entirely or partially on the conductive pattern 12 except a region for connecting the connecting portions 23 and a region for connecting a package electrode (not shown). The recessed portion 12b is formed by, e.g., etching using photolithography.

The light reflecting film 13 is formed of, e.g., a resin material containing a white filler. The white filler is formed of fine particles of, e.g., titanium oxide, aluminum oxide or boron nitride. Use of titanium oxide which is stable and cheap is especially preferable. The resin material is, e.g., a silicon-based resin or an epoxy-based resin. Use of a silicon-based resin which is excellent in heat resistance is especially preferable. Screen printing or a dispensing step of dropping a liquid resin is performed to form the light reflecting film 13 in the inter-pattern gap 12a and the recessed portion 12b of the conductive pattern 12. In addition, an upper surface level of the conductive pattern 12 in a region without the recessed portion 12b is equal to an upper surface level of the light reflecting film 13 when the light reflecting film 13 is flattened. The light reflecting film 13 is formed by such an insulating film that there is no possibility that leak current in the conductive pattern 12 would occur via the light reflecting film 13.

The light reflecting film 13 has a function of reflecting light which is emitted from the LED chip 20 and travels toward the base substrate 11, thereby suppressing light absorption by the base substrate 11 and the conductive pattern 12. Accordingly, with respect to the wavelength of light emitted from the LED chip 20, the light reflecting film 13 has a reflectivity higher than the base substrate 11 and the conductive pattern 12. The function of the light reflecting film 13 is significant especially when the base substrate 11 is a substrate having low light reflectivity, such as a ceramic substrate.

Figure 2:
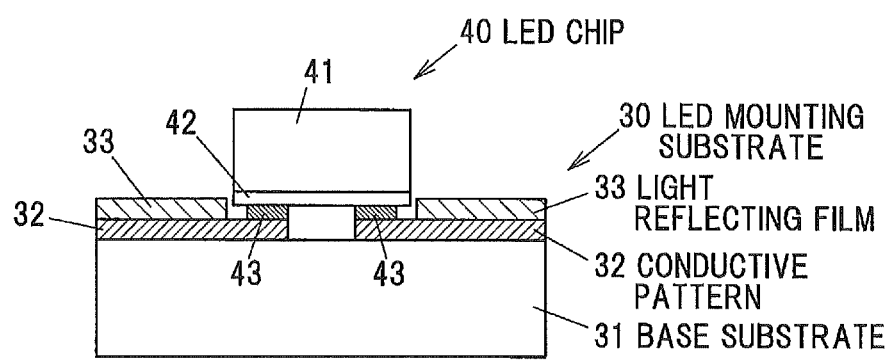
FIG. 2 is a vertical cross-sectional view showing an LED mounting substrate and an LED chip in Comparative Example.

FIG. 2 is a vertical cross-sectional view showing an LED mounting substrate and an LED chip in Comparative Example. An LED mounting substrate 30 in Comparative Example has a base substrate 31, a conductive pattern 32 on the base substrate 31 and a light reflecting film 33 on the conductive pattern 32. In addition, an LED chip 40 having a chip substrate 41 and a crystal layer 42 is connected to the conductive pattern 32 of the LED mounting substrate 30 via connecting portions 43.

In the LED mounting substrate 30, a recessed portion is not provided on the conductive pattern 32 and the light reflecting film 33 is formed on the conductive pattern 32. Accordingly, the light reflecting film 33 is located lateral to the LED chip 40, which makes difficult to mount the LED chip 40 or may block light laterally emitted from the LED chip 40. In addition, if the light reflecting film 33 is formed at a position away from the LED chip 40 so that such problems are avoided, light emitted from the LED chip 40 cannot be effectively reflected and it is not possible to sufficiently improve light extraction efficiency of the light-emitting device.

An example of a method of manufacturing the LED mounting substrate 10 will be described below, in which the light reflecting film 13 is formed by screen printing.

FIGS. 3A to 3D are cross sectional views showing a manufacturing process of the LED mounting substrate 10 in the first embodiment.

Figure 3A:
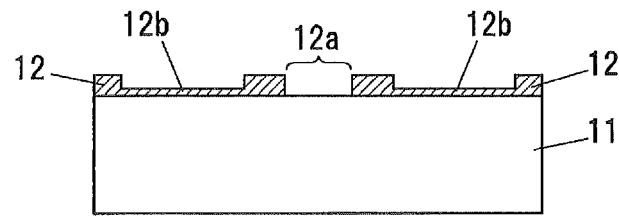
FIGS. 3A to 3D are cross sectional views showing a manufacturing process of the LED mounting substrate in the first embodiment.

Firstly, the conductive pattern 12 having the recessed portion 12b on the upper surface thereof is formed on the base substrate 11, as shown in FIG. 3A. After a metal film is formed on the base substrate 11 by, e.g., an evaporation method, etching using photolithography is performed to pattern the metal film and to form the recessed portion 12b, thereby obtaining the conductive pattern 12.

Figure 3B:
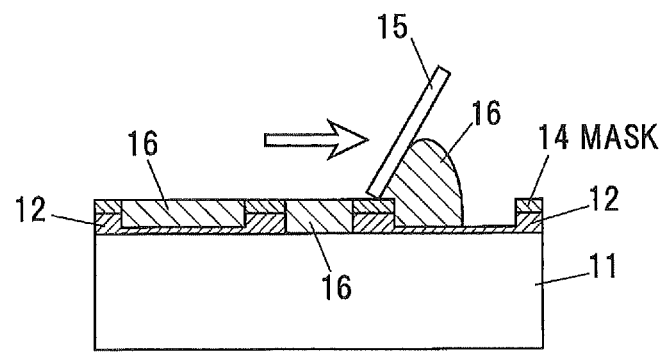

Next, as shown in FIG. 3B, a light-reflecting resin 16 is filled in the inter-pattern gap 12a and the recessed portion 12b of the conductive pattern 12 by screen printing. The conductive pattern 12 is covered with a mask 14 which has a patterned opening corresponding to the pattern of the inter-pattern gap 12a and the recessed portion 12b of the conductive pattern 12, the light-reflecting resin 16 in a liquid form is then placed on the mask 14 and a scraper 15 is moved on the mask 14, thereby filling the light-reflecting resin 16 in the inter-pattern gap 12a and the recessed portion 12b of the conductive pattern 12 through the opening of the mask 14.

Figure 3C:
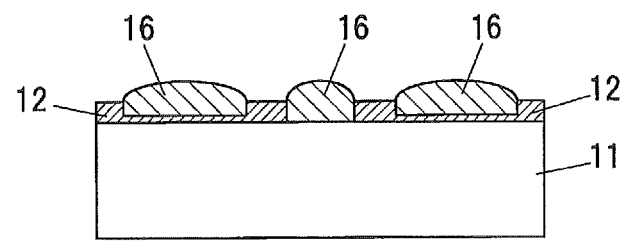

Next, as shown in FIG. 3C, the light-reflecting resin 16 is cured by heat treatment. The light-reflecting resin 16 may expand with heat.

Figure 3D:
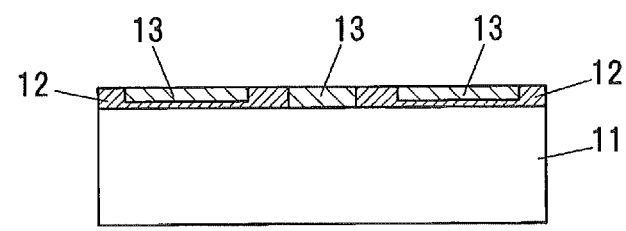

Next, as shown in FIG. 3D, the light-reflecting resin 16 is flattened by, e.g., physical polishing, thereby forming the light reflecting film 13 having an upper surface level equal to that of the conductive pattern 12 in the region without the recessed portion 12b.

Effects of the First Embodiment

In the LED mounting substrate 10 of the first embodiment, it is possible to effectively reflect the light emitted from the LED chip 20 and to suppress light absorption by the base substrate 11 and the conductive patterns 12 by forming the light reflecting film 13 in the inter-pattern gap 12a and the recessed portion 12b of the conductive pattern 12. Therefore, it is possible to manufacture a light-emitting device excellent in light extraction efficiency by using the LED mounting substrate 10.

Second Embodiment

In the second embodiment, an example of a method of manufacturing the LED mounting substrate 10 is shown, in which the light reflecting film 13 is formed by a coating process without using a mask.

FIGS. 4A to 4D are cross sectional views showing a manufacturing process of the LED mounting substrate 10 in the second embodiment.

Figure 4A:
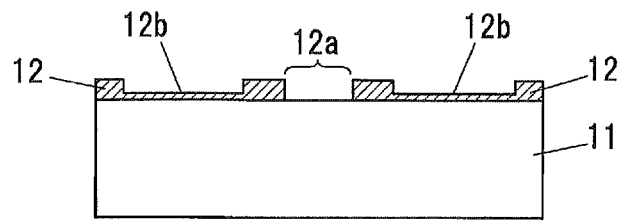
FIGS. 4A to 4D are cross sectional views showing a manufacturing process of an LED mounting substrate in a second embodiment.

Firstly, the conductive pattern 12 having the recessed portion 12b on the upper surface thereof is formed on the base substrate 11, as shown in FIG. 4A.

Figure 4B:
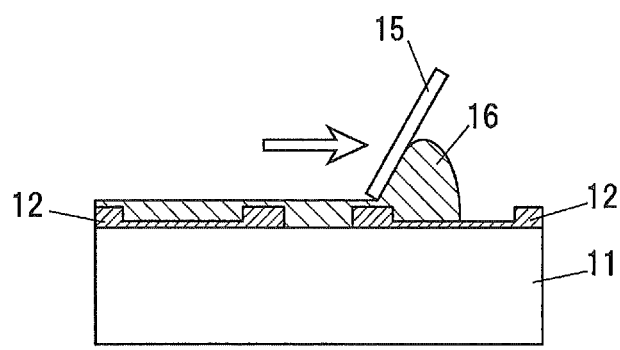

Next, as shown in FIG. 4B, the light-reflecting resin 16 is applied onto the entire surface of the base substrate 11 and the conductive pattern 12, thereby filling the light-reflecting resin 16 in the inter-pattern gap 12a and the recessed portion 12b of the conductive pattern 12. The light-reflecting resin 16 is directly applied onto the base substrate 11 and of the conductive pattern 12 without using a screen-printing mask, etc. The light-reflecting resin 16 is applied using, e.g., the scraper 15. At this time, the light-reflecting resin 16 may be applied to the conductive pattern 12 in the region without the recessed portion 12b.

Figure 4C:
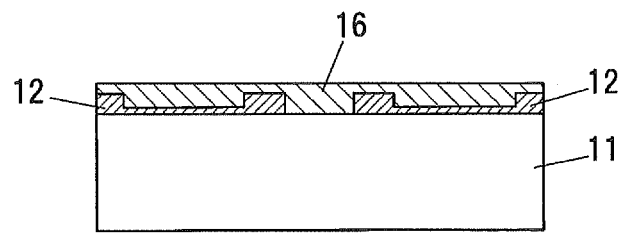

Next, as shown in FIG. 4C, the light-reflecting resin 16 is cured by heat treatment. The light-reflecting resin 16 may expand with heat.

Figure 4D:
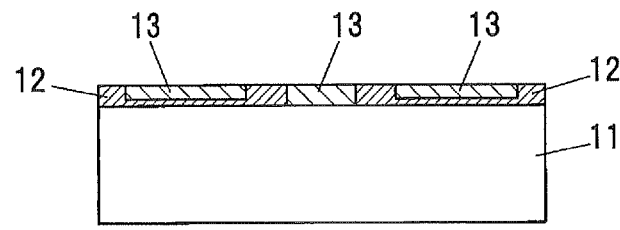

Next, as shown in FIG. 4D, the light-reflecting resin 16 is flattened by, e.g., physical polishing, thereby forming the light reflecting film 13 having an upper surface level equal to that of the conductive pattern 12 in the region without the recessed portion 12b. The light-reflecting resin 16 on the conductive pattern 12 in the region without the recessed portion 12b is removed by the flattening.

Effects of the Second Embodiment

According to the second embodiment, it is possible to form the light-reflecting resin 16 without using a screen-printing mask, etc., and also it is possible to form the light reflecting film 13 at high accuracy since it is not affected by, e.g., accuracy of mask pattern.

The present invention is not intended to be limited to the above-mentioned embodiments, and the various kinds of modifications can be implemented without departing from the gist of the invention.

In addition, the invention according to claims is not to be limited to the above-mentioned embodiments. Further, please note that all combinations of the features described in the embodiments are not necessary to solve the problem of the invention.

What is claimed is:

1. An LED mounting substrate, comprising:
    a base substrate;
    a conductive pattern formed on the base substrate and comprising a recessed portion on an upper surface thereof; and
    a light reflecting film formed in an inter-pattern gap of the conductive pattern on the base substrate and in the recessed portion of the conductive pattern.

2. The LED mounting substrate according to claim 1, wherein an upper surface level of the conductive pattern in a region without the recessed portion is equal to an upper surface level of the light reflecting film.

3. The LED mounting substrate according to claim 1, wherein the light reflecting film comprises a resin material containing a white filler.

4. The LED mounting substrate according to claim 1, wherein the light reflecting film comprises an insulating film.

5. The LED mounting substrate according to claim 1, wherein the light reflecting film has a reflectivity higher than the base substrate and the conductive pattern.

6. The LED mounting substrate according to claim 5, wherein the base substrate comprises a ceramic substrate.

7. A method of manufacturing an LED mounting substrate, comprising:
    forming a conductive pattern on the base substrate, the conductive pattern comprising a recessed portion on an upper surface thereof;
    filling a light-reflecting resin in an inter-pattern gap of the conductive pattern and also in the recessed portion of the conductive pattern; and
    forming a light reflecting film by flattening the light-reflecting resin so that the light reflecting film has an upper surface level equal to that of the conductive pattern in a region with no recessed portion.

8. The method according to claim 7, wherein the filling of the light-reflecting resin is performed by screen printing.

9. The method according to claim 7, wherein the light-reflecting resin is applied onto an entire surface of the base substrate and the conductive pattern so as to fill the light-reflecting resin in the inter-pattern gap of the conductive pattern and in the recessed portion of the conductive pattern.

* * * * *